(12) United States Patent
Mizuno et al.

(10) Patent No.: US 10,508,222 B2
(45) Date of Patent: Dec. 17, 2019

(54) POLISHING COMPOSITION AND POLISHING METHOD USING SAME

(71) Applicant: FUJIMI INCORPORATED, Kiyosu-shi, Aichi (JP)

(72) Inventors: Takahiro Mizuno, Kiyosu (JP); Shuugo Yokota, Kiyosu (JP); Yasuyuki Yamato, Kiyosu (JP); Tomohiko Akatsuka, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 15/967,011

(22) Filed: Apr. 30, 2018

(65) Prior Publication Data
US 2018/0244957 A1  Aug. 30, 2018

Related U.S. Application Data

(63) Continuation of application No. 13/818,058, filed as application No. PCT/JP2011/068217 on Aug. 10, 2011, now abandoned.

(30) Foreign Application Priority Data

Aug. 23, 2010 (JP) ................ 2010-186427

(51) Int. Cl.
C09G 1/02 (2006.01)
H01L 21/321 (2006.01)
C09K 3/14 (2006.01)
H01L 21/3105 (2006.01)

(52) U.S. Cl.
CPC ............. C09G 1/02 (2013.01); C09K 3/1436 (2013.01); C09K 3/1463 (2013.01); H01L 21/31053 (2013.01); H01L 21/3212 (2013.01); H01L 21/32115 (2013.01)

(58) Field of Classification Search
None
See application file for complete search history.

(56) References Cited

U.S. PATENT DOCUMENTS

| | | | |
|---|---|---|---|
| 5,709,588 A | 1/1998 | Muroyama | |
| 6,098,638 A * | 8/2000 | Miyashita | B24B 37/042 134/1.3 |
| 6,776,810 B1 | 8/2004 | Cherian et al. | |
| 7,044,836 B2 | 5/2006 | Sun et al. | |
| 2004/0209555 A1 | 10/2004 | Sun et al. | |
| 2005/0189322 A1 | 9/2005 | Lane et al. | |
| 2006/0021972 A1 | 2/2006 | Lane et al. | |
| 2006/0030155 A1 | 2/2006 | Kim et al. | |
| 2006/0243702 A1 | 11/2006 | Minamihaba et al. | |
| 2007/0007248 A1 | 1/2007 | Lane et al. | |
| 2007/0045234 A1 | 3/2007 | Lane et al. | |
| 2007/0075291 A1 | 4/2007 | Paik et al. | |
| 2007/0190789 A1 | 8/2007 | Carter et al. | |
| 2007/0196975 A1 | 8/2007 | Nomura et al. | |
| 2007/0202703 A1 | 8/2007 | Shimizu et al. | |
| 2007/0224806 A1 | 9/2007 | Yamashita et al. | |
| 2007/0232197 A1 | 10/2007 | Amanokura et al. | |
| 2008/0125017 A1 | 5/2008 | Shimizu et al. | |
| 2008/0182485 A1 | 7/2008 | Siddiqui et al. | |
| 2009/0068839 A1 | 3/2009 | Kim et al. | |
| 2009/0081927 A1 | 3/2009 | Grumbine et al. | |
| 2009/0117829 A1 | 5/2009 | Ono et al. | |
| 2009/0202816 A1 | 8/2009 | Schlenoff | |
| 2009/0267021 A1 | 10/2009 | Nakajo et al. | |
| 2010/0001229 A1 | 1/2010 | Nakagawa et al. | |
| 2010/0009538 A1 | 1/2010 | Kamimura | |
| 2010/0068883 A1 | 3/2010 | Shin et al. | |
| 2010/0072418 A1 * | 3/2010 | Mizutani | C09G 1/02 252/79.1 |
| 2010/0144149 A1 | 6/2010 | Ward et al. | |
| 2010/0181525 A1 | 7/2010 | Belmont | |
| 2010/0323584 A1 | 12/2010 | Haga et al. | |
| 2011/0198531 A1 | 8/2011 | Tanaka | |
| 2013/0005219 A1 | 1/2013 | Takemura et al. | |
| 2013/0217229 A1 | 8/2013 | Haga et al. | |
| 2014/0349484 A1 | 11/2014 | Yokota et al. | |

FOREIGN PATENT DOCUMENTS

| | | |
|---|---|---|
| CN | 1610963 A | 4/2005 |
| CN | 1660923 A | 8/2005 |
| CN | 1727431 A | 2/2006 |
| CN | 101041769 A | 9/2007 |
| CN | 101186711 A | 5/2008 |
| CN | 101573425 A | 11/2009 |
| CN | 101802116 A | 8/2010 |
| EP | 2 533 274 A | 12/2012 |
| EP | 2 610 031 A1 | 7/2013 |
| JP | H0982668 | 3/1997 |

(Continued)

OTHER PUBLICATIONS

Cano-Serrano et al., "Sulfonic acid-functionalized silica through quantitative oxidation of thiol groups", Chem. Commun., Dec. 11, 2002, pp. 246-247.

English translation of JP 2010-269985 A as cited in the Non-Final Office Action dated May 6, 2016 received in U.S. Appl. No. 14/368,458.

Translation of International Preliminary Report on Patentabliliy of PCT/JP2011/068217, dated Mar. 19, 2013, 5 pages.

Office Action in U.S. Appl. No. 14/368,458 dated Dec. 16, 2014.

U.S. Office Action issued in U.S. Appl. No. 14/368,458 dated Nov. 25, 2015.

Yamaguchi et al. "Novel Silane Coupling Agents Containing a Photolabile 2-Nitrobenzyl Ester for Introduction of a Carboxy Group on the Surface of Silica Gel", Chemistry Letters, No. 3, pp. 228-229 (2000).

Yokota: Non-Final Office Action dated May 6, 2016 as received in U.S. Appl. No. 14/368,458.

(Continued)

Primary Examiner — Stephanie P Duclair
(74) Attorney, Agent, or Firm — Foley & Lardner LLP

(57) ABSTRACT

A polishing composition used in an application to polish silicon nitride is characterized by containing colloidal silica in which an organic acid, such as a sulfonic acid or a carboxylic acid, is immobilized, and having a pH of 6 or less.

9 Claims, No Drawings

(56) References Cited

FOREIGN PATENT DOCUMENTS

| | | |
|---|---|---|
| JP | 2001-127020 A | 5/2001 |
| JP | 2003-064351 A | 3/2003 |
| JP | 2005-162533 A | 6/2005 |
| JP | 2005-518091 A | 6/2005 |
| JP | 2006-049912 A | 2/2006 |
| JP | 2006-524918 A | 11/2006 |
| JP | 2007-277025 A | 10/2007 |
| JP | 2007-335847 A | 12/2007 |
| JP | 2009-526659 A | 7/2009 |
| JP | 2009-238954 A | 10/2009 |
| JP | 2009-289885 A | 12/2009 |
| JP | 2009-289886 A | 12/2009 |
| JP | 2010-041037 A | 2/2010 |
| JP | 2010-056127 A | 3/2010 |
| JP | 2010-103409 A | 5/2010 |
| JP | 2010-269985 A | 12/2010 |
| JP | 2011-020208 A | 2/2011 |
| JP | 2011-165759 A | 8/2011 |
| TW | H06-124932 A | 5/1994 |
| TW | 2007-38856 A | 10/2007 |
| TW | 2010-05077 A | 2/2010 |
| WO | WO 2004/094547 A2 | 11/2004 |
| WO | WO-2009/008431 A1 | 1/2009 |
| WO | WO-2010/047314 A1 | 4/2010 |
| WO | WO-2010/065125 A1 | 6/2010 |
| WO | WO-2010/085324 A1 | 7/2010 |
| WO | WO-2011-093153 A1 | 8/2011 |

OTHER PUBLICATIONS

Yokota: U.S. Office Action issued in U.S. Appl. No. 14/368,458, dated Oct. 21, 2016.
Examiner's Answer to Appeal Brief mailed in co-pending U.S. Appl. No. 14/368,458 dated Oct. 10, 2017.
Taiwanese Office Action and English translation thereof issued in corresponding application No. 105143846 dated Jun. 12, 2017.
Taiwanese Decision to Grant a Patent and English translation thereof issued in corresponding application No. 105143846 dated Jan. 17, 2018.
Extended European Search Report dated Sep. 5, 2018 in Application No. 18179047.8.

* cited by examiner

POLISHING COMPOSITION AND POLISHING METHOD USING SAME

CROSS-REFERENCE TO RELATED APPLICATIONS

The present application is a continuation of U.S. application Ser. No. 13/818,058, filed Feb. 20, 2013, which is a national stage entry of International application no. PCT/JP2011/068217, filed Aug. 10, 2011, which claims priority to Japanese application no. 2010-186427, filed Aug. 23, 2010. The entire contents of which are incorporated herein by reference.

TECHNICAL FIELD

The present invention relates to a polishing composition used, for example, in the manufacturing process of a semiconductor device and to a polishing method using the same.

BACKGROUND ART

In the manufacturing process of a semiconductor device, there exists a need to polish silicon nitride, which is chemically unreactive, at a high rate of speed. Most of polishing compositions that have been conventionally used to polish silicon nitride contain abrasive grains and an acid. For example, Patent Document 1 discloses a polishing composition that contains phosphoric acid or a phosphoric acid derivative. Patent Document 2 discloses a polishing composition that contains colloidal silica and an organic acid having a sulfonate group or a phosphonate group and has a pH of 2.5 to 5. These conventional polishing compositions, however, do not adequately satisfy users' needs for the rate of polishing silicon nitride.

PRIOR ART DOCUMENTS

Patent Document 1: Japanese Laid-Open Patent Publication No. 6-124932
Patent Document 2: Japanese Laid-Open Patent Publication No. 2010-41037

SUMMARY OF THE INVENTION

Problems that the Invention is to Solve

Accordingly, it is an objective of the present invention to provide a polishing composition that can polish silicon nitride at a higher rate of speed, and a polishing method using the same.

Means for Solving the Problems

To achieve the foregoing objective and in accordance with one aspect of the present invention, a polishing composition used in an application to polish silicon nitride is provided. The polishing composition contains colloidal silica in which an organic acid is immobilized and has a pH of 6 or less.

Another aspect of the present invention provides a polishing method for polishing silicon nitride using the polishing composition according to the above described aspect.

Effects of the Invention

According to the present invention, there is provided a polishing composition that can polish silicon nitride at a high rate of speed, and a polishing method using the same.

MODES FOR CARRYING OUT THE INVENTION

One embodiment of the present invention will now be described.

A polishing composition according to the present embodiment is prepared by mixing with water colloidal silica in which an organic acid is immobilized. Therefore, the polishing composition contains colloidal silica in which an organic acid is immobilized. The polishing composition is mainly used in an application to polish silicon nitride, more specifically an application to polish an object-to-be-polished, such as a semiconductor wiring substrate, the surface of which includes silicon nitride.

The immobilization of an organic acid on the surface of colloidal silica in the polishing composition is carried out by chemically bonding a functional group of the organic acid to the surface of colloidal silica. The immobilization of an organic acid on colloidal silica cannot be achieved by only allowing colloidal silica and an organic acid to merely coexist. The immobilization of a sulfonic acid, a kind of organic acid, on colloidal silica can be carried out, for example, by a method described in "Sulfonic acid-functionalized silica through quantitative oxidation of thiol groups", Chem. Commun. 246-247 (2003). Specifically, colloidal silica in which a sulfonic acid is immobilized on its surface can be obtained by coupling a silane coupling agent having a thiol group, such as 3-mercaptopropyl trimethoxysilane, to colloidal silica, followed by oxidizing the thiol group with hydrogen peroxide. The immobilization of a carboxylic acid on colloidal silica can be carried out, for example, by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, colloidal silica in which a carboxylic acid is immobilized on its surface can be obtained by coupling a silane coupling agent including photoreactive 2-nitrobenzyl ester to colloidal silica, followed by photoirradiation.

The average primary particle size of colloidal silica in the polishing composition is preferably 5 nm or more, more preferably 7 nm or more, and further preferably 10 nm or more. As the average primary particle size of colloidal silica increases, there is the advantage of improving the rate of polishing silicon nitride with the polishing composition.

The average primary particle size of colloidal silica in the polishing composition is also preferably 100 nm or less, more preferably 90 nm or less, and further preferably 80 nm or less. As the average primary particle size of colloidal silica decreases, there is the advantage of being able to suppress the occurrence of scratches on the surface of an object-to-be-polished after polishing using the polishing composition. The value of the average primary particle size of colloidal silica is calculated based on, for example, the specific surface area of colloidal silica measured by the BET method.

The average secondary particle size of colloidal silica in the polishing composition is preferably 10 nm or more, more preferably 20 nm or more, and further preferably 30 nm or more. As the average secondary particle size of colloidal silica increases, there is the advantage of improving the rate of polishing silicon nitride with the polishing composition.

The average secondary particle size of colloidal silica in the polishing composition is also preferably 150 nm or less, more preferably 120 nm or less, and further preferably 100 nm or less. As the average secondary particle size of colloidal silica decreases, there is the advantage of being able to suppress the occurrence of scratches on the surface of an object-to-be-polished after polishing using the polishing composition. The value of the average secondary particle size of colloidal silica can be measured by, for example, a light scattering method using laser light.

The shape of colloidal silica in the polishing composition is preferably non-spherical. Non-spherical colloidal silica may be one in which two or more primary particles are associated.

The average degree of association of colloidal silica in the polishing composition is preferably 1.2 or more and more preferably 1.5 or more. As the average degree of association of colloidal silica increases, there is the advantage of improving the rate of polishing silicon nitride with the polishing composition.

The average degree of association of colloidal silica in the polishing composition is also preferably 4.0 or less, more preferably 3.0 or less, and further preferably 2.5 or less. As the average degree of association of colloidal silica decreases, there is the advantage of being able to suppress the occurrence of defects and the increase in surface roughness on the surface of an object-to-be-polished after polishing using the polishing composition.

The content of colloidal silica in the polishing composition is preferably 0.05% by mass or more, more preferably 0.1% by mass or more, and further preferably 1% by mass or more. As the content of colloidal silica increases, there is the advantage of improving the rate of polishing silicon nitride with the polishing composition.

The content of colloidal silica in the polishing composition is also preferably 20% by mass or less, more preferably 15% by mass or less, and further preferably 10% by mass or less. As the content of colloidal silica decreases, there are the advantages of being able to reduce the material cost of the polishing composition, and also of being able to suppress the occurrence of aggregation of colloidal silica.

The pH value of the polishing composition is required to be 6 or less. When the pH is above 6, it is difficult to polish silicon nitride at a high rate of speed using a polishing composition. In terms of a further improvement in the rate of polishing silicon nitride with the polishing composition, the pH value of the polishing composition is preferably 5 or less, more preferably 4.5 or less, and further preferably 4 or less.

The pH value of the polishing composition is also preferably 1 or more, more preferably 1.5 or more, further preferably 2 or more, and particularly preferably 2.5 or more. As the pH of the polishing composition increases, there is the advantage of being able to increase the ratio of the rate of polishing silicon nitride with the polishing composition to the rate of polishing polycrystalline silicon with the polishing composition, that is, there is the advantage of being able to polish more preferentially silicon nitride relative to polycrystalline silicon.

A pH adjuster may be used to adjust the pH of the polishing composition to the desired value thereof. The pH adjuster used may be either an inorganic acid or an organic acid, or a chelating agent.

Specific examples of inorganic acids that can be used as a pH adjuster include hydrochloric acid, sulfuric acid, nitric acid, hydrofluoric acid, boric acid, carbonic acid, hypophosphorous acid, phosphorous acid, and phosphoric acid. Among these, preferred are hydrochloric acid, sulfuric acid, nitric acid, and phosphoric acid.

Specific examples of organic acids that can be used as a pH adjuster include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid. Organic sulfuric acids, such as methanesulfonic acid, ethanesulfonic acid, and isethionic acid, may be also used. Among these, preferred are dicarboxylic acids, such as malonic acid, succinic acid, glutaric acid, adipic acid, pimelic acid, maleic acid, phthalic acid, malic acid, and tartaric acid, and tricarboxylic acids, such as citric acid.

Salts, such as an ammonium salt and alkali metal salt of an inorganic acid or organic acid, may be used as a pH adjuster in place of an inorganic acid or organic acid, or in combination with an inorganic acid or organic acid. When combining a weak acid and a strong base, a strong acid and a weak base, or a weak acid and a weak base, a pH buffering action can be expected.

Specific examples of chelating agents that can be used as a pH adjuster include hydroxyethyl iminodiacetic acid, iminodiacetic acid, acetamide iminodiacetic acid, nitrilotripropanoic acid, nitrilotrimethylphosphonic acid, nitrilotriacetic acid, diethylenetriamine pentaacetic acid, and ethylenediamine tetraacetic acid.

The polishing composition can polish silicon nitride at a high rate of speed, whereas is not required to polish polycrystalline silicon at a high rate of speed. Such ability can be required when the polishing composition is used in an application to polish an object-to-be-polished the surface of which includes not only silicon nitride but also polycrystalline silicon. In this case, the ratio of the rate of polishing silicon nitride to the rate of polishing polycrystalline silicon is preferably 2 or more, more preferably 4 or more, further preferably 6 or more, and particularly preferably 8 or more.

According to the present embodiment, the following advantages are obtained.

A polishing composition of the present embodiment contains colloidal silica in which an organic acid, such as a sulfonic acid or a carboxylic acid, is immobilized, and has a pH of 6 or less. The zeta-potential of colloidal silica in which an organic acid is immobilized is negative under a pH of 6 or less. On the other hand, the zeta-potential of silicon nitride is positive under the same condition as above, that is, a pH of 6 or less. Thus, when the pH of the polishing composition is 6 or less, colloidal silica in the polishing composition is not electrically repelled from silicon nitride. Therefore, silicon nitride can be polished at a high rate of speed with the polishing composition.

When the average primary particle size of colloidal silica in the polishing composition is 5 nm or more, and specifically 7 nm or more or 10 nm or more, the rate of polishing silicon nitride with the polishing composition is further improved.

When the average primary particle size of colloidal silica in the polishing composition is 100 nm or less, and specifically 90 nm or less or 80 nm or less, the occurrence of scratches on the surface of an object-to-be-polished after polishing using the polishing composition is favorably suppressed.

When the average secondary particle size of colloidal silica in the polishing composition is 10 nm or more, and specifically 20 nm or more or 30 nm or more, the rate of polishing silicon nitride with the polishing composition is further improved.

When the average secondary particle size of colloidal silica in the polishing composition is 150 nm or less, and specifically 120 nm or less or 100 nm or less, the occurrence of scratches on the surface of an object-to-be polished after polishing using the polishing composition is favorably suppressed.

When the average degree of association of colloidal silica in the polishing composition is 1.2 or more, and specifically 1.5 or more, the rate of polishing silicon nitride with the polishing composition is further improved.

When the shape of colloidal silica in the polishing composition is non-spherical, the rate of polishing silicon nitride with the polishing composition is further improved.

When the average degree of association of colloidal silica in the polishing composition is 4.0 or less, and specifically 3.0 or less or 2.5 or less, the occurrence of defects and the increase in surface roughness on the surface of an object-to-be-polished after polishing using the polishing composition is favorably suppressed.

When the content of colloidal silica in the polishing composition is 0.05% by mass or more, and specifically 0.1% by mass or more or 1% by mass or more, the rate of polishing silicon nitride with the polishing composition is further improved.

When the content of colloidal silica in the polishing composition is 20% by mass or less, and specifically 15% by mass or less or 10% by mass or less, the material cost of the polishing composition is reduced, and the occurrence of aggregation of colloidal silica is also suppressed.

When the pH value of the polishing composition is 5 or less, and specifically 4.5 or less or 4 or less, the rate of polishing silicon nitride with the polishing composition is further improved.

When the pH value of the polishing composition is 1 or more, and specifically 1.5 or more, 2 or more, or 2.5 or more, the ratio of the rate of polishing silicon nitride with the polishing composition to the rate of polishing polycrystalline silicon with the polishing composition is increased.

When the ratio of the rate of polishing silicon nitride with the polishing composition to the rate of polishing polycrystalline silicon with the polishing composition is 2 or more, and specifically 4 or more, 6 or more, or 8 or more, in the case where the polishing composition is used in an application to polish an object-to-be-polished the surface of which includes silicon nitride and polycrystalline silicon, silicon nitride is more preferentially polished relative to polycrystalline silicon.

The above embodiment may be modified as follows.

A polishing composition of the above embodiment may contain, in addition to colloidal silica in which an organic acid is immobilized, any other abrasive grains.

A polishing composition of the above embodiment may further contain a water-soluble polymer. The water-soluble polymer can control the rate of polishing an object-to-be-polished with the polishing composition by adhering to the surface of colloidal silica or the surface of the object-to-be-polished, and also has a function to stabilize insoluble components to be produced during polishing in the polishing composition. Examples of water-soluble polymers that can be used include a compound having a polyoxyalkylene chain, more specifically, polyethylene glycol, polypropylene glycol, polyoxyethylene alkyl ether, polyoxyethylene lauryl ether sulfate, polyoxyethylene lauryl ether acetate, polyoxyethylene alkyl phosphate, and a silicone oil having a polyoxyalkylene chain. Among these, preferred are polyethylene glycol and polypropylene glycol.

When a polishing composition of the above embodiment contains a water-soluble polymer, the content of water-soluble polymer in the polishing composition is preferably 0.001 g/L or more, more preferably 0.005 g/L or more, and further preferably 0.01 g/L or more. As the content of water-soluble polymer increases, there is the advantage of being able to increase the ratio of the rate of polishing silicon nitride with the polishing composition to the rate of polishing polycrystalline silicon with the polishing composition, that is, there is the advantage of being able to polish more preferentially silicon nitride relative to polycrystalline silicon.

When a polishing composition of the above embodiment contains a water-soluble polymer, the content of water-soluble polymer in the polishing composition is preferably 10 g/L or less, more preferably 5 g/L or less, and further preferably 1 g/L or less. As the content of water-soluble polymer decreases, there is the advantage of improving the rate of polishing polycrystalline silicon with the polishing composition.

A polishing composition of the above embodiment may further contain an oxidizing agent, such as hydrogen peroxide.

A polishing composition of the above embodiment may further contain a known additive, such as a preservative and a fungicide, as required. Specific examples of preservatives and fungicides include: isothiazoline antiseptics, such as 2-methyl-4-isothiazolin-3-one and 5-chloro-2-methyl-4-isothiazolin-3-one; para-oxybenzoates; and phenoxyethanol.

A polishing composition of the above embodiment may be either a one-component type or a multi-component type including a two-component type.

A polishing composition of the above embodiment may be prepared by diluting an undiluted solution of the polishing composition, for example, 10-fold or more, with a diluent, such as water.

A polishing composition of the above embodiment may be used in applications other than polishing silicon nitride.

Next, examples and comparative examples of the present invention will be described.

In Examples 1 to 14 and Comparative Examples 1 to 4, colloidal silica was mixed into water, and a pH adjuster was properly added thereto to prepare a polishing composition. In Comparative Example 5, water adjusted to a pH of 2 using a pH adjuster was prepared as a polishing composition. The details of colloidal silica and a pH adjuster used in each polishing composition, and the results of pH measurement in each polishing composition are shown in Table 1.

In the column entitled "colloidal silica"" in Table 1, "A" represents colloidal silica in which a sulfonic acid is immobilized, and "B" represents colloidal silica in which an organic acid is not immobilized. The average degree of association of colloidal silica used in each example was 2.

The polishing rate when the surface of a silicon nitride film blanket wafer and the surface of a polysilicon film blanket wafer with a diameter of 200 mm were polished for 60 seconds using each polishing composition under the polishing conditions described in Table 2 is shown in the column entitled "polishing speed" in Table 1. The value of the polishing rate was obtained by dividing by polishing time the difference in the thickness of each wafer before and after polishing, measured using a spectrometric film thickness measurement system of DAINIPPON SCREEN MFG. CO., LTD., "Lambda Ace VM-2030". In addition, a value obtained by dividing the rate of polishing silicon nitride with each polishing composition by the rate of polishing polycrystalline silicon with the same polishing composition, thus obtained, is shown in the column entitled "rate of polishing silicon nitride/rate of polishing polycrystalline silicon" in Table 1.

TABLE 1

| | Abrasive grains | | | | | | Polishing rate | | Rate of polishing |
|---|---|---|---|---|---|---|---|---|---|
| | Type | Content [mass %] | Average primary particle size [nm] | Average secondary particle size [nm] | pH adjuster | pH | Silicon nitride [nm/min.] | Polycrystalline silicon [nm/min.] | silicon nitride/ rate of polishing polycrystalline silicon |
| Example 1 | A | 5 | 12.3 | 31.8 | nitric acid | 1 | 80 | 15 | 5.3 |
| Example 2 | A | 5 | 12.3 | 31.8 | nitric acid | 2 | 76 | 13 | 5.8 |
| Example 3 | A | 5 | 12.3 | 31.8 | citric acid | 2 | 74 | 11 | 6.6 |
| Example 4 | A | 5 | 12.3 | 31.8 | maleic acid | 2 | 74 | 11 | 6.6 |
| Example 5 | A | 5 | 12.3 | 31.8 | maleic acid | 3 | 58 | 6 | 9.0 |
| Example 6 | A | 5 | 12.3 | 31.8 | acetic acid | 3 | 50 | 25 | 2.0 |
| Example 7 | A | 5 | 12.3 | 31.8 | citric acid | 4 | 57 | 8 | 7.6 |
| Example 8 | A | 5 | 12.3 | 31.8 | maleic acid | 4 | 56 | 7 | 8.0 |
| Example 9 | A | 5 | 12.3 | 31.8 | oxalic acid | 5 | 42 | 15 | 2.9 |
| Example 10 | A | 5 | 12.3 | 31.8 | maleic acid | 5 | 44 | 13 | 3.4 |
| Example 11 | A | 5 | 12.3 | 31.8 | oxalic acid | 6 | 33 | 10 | 3.3 |
| Example 12 | A | 5 | 12.3 | 31.8 | maleic acid | 6 | 32 | 9 | 3.6 |
| Example 13 | A | 5 | 35.3 | 67 | nitric acid | 2 | 69 | 10 | 6.8 |
| Example 14 | A | 5 | 16.5 | 23 | acetic acid | 3 | 51 | 30 | 1.7 |
| Comparative Example 1 | B | 5 | 12.3 | 31.8 | maleic acid | 3 | 24 | 11 | 2.1 |
| Comparative Example 2 | B | 5 | 12.3 | 31.8 | phosphoric acid | 3 | 18 | 7 | 2.6 |
| Comparative Example 3 | B | 5 | 12.3 | 31.8 | sulfonic acid | 3 | 25 | 12 | 2.1 |
| Comparative Example 4 | A | 5 | 12.3 | 31.8 | — | 7 | 20 | 7 | 2.9 |
| Comparative Example 5 | — | — | — | — | nitric acid | 2 | 0 | 0 | — |

TABLE 2

| | |
|---|---|
| Polishing machine: | Polisher for single-side CMP (Mirra manufactured by Applied Materials, Inc.) |
| Polishing pad: | IC-1010 M Groove manufactured by Rohm and Haas Company |
| Polishing pressure: | 4 psi (=approximately 28 kPa) |
| Rotation rate of surface plate: | 81 rpm |
| Rotation rate of head: | 75 rpm |
| Feed rate of polishing composition: | 200 mL/min |
| Revolution rate of carrier: | 90 rpm |

As shown in Table 1, in all cases when using the polishing composition of each of Examples 1 to 14, silicon nitride could be polished at a polishing rate of above 30 nm/min. On the contrary, in the cases of the polishing compositions of each of Comparative Examples 1 to 3, not containing colloidal silica in which an organic acid was immobilized, and in the case of the polishing composition of Comparative Example 4, containing colloidal silica in which a sulfonic acid was immobilized but having a pH of above 6, the obtained values about the rate of polishing silicon nitride were low. In addition, in the case of the polishing composition of Comparative Example 5, not containing colloidal silica, silicon nitride could not be polished at all.

The invention claimed is:

1. A method for preparing a polishing composition comprising:
   preparing colloidal silica in which a sulfonic acid is immobilized;
   mixing the colloidal silica, in which a sulfonic acid is immobilized, with water to obtain a polishing composition; and
   adjusting the pH of the obtained polishing composition to 6 or less,
   wherein said preparing colloidal silica in which a sulfonic acid is immobilized includes:
   coupling a silane coupling agent having a thiol group to colloidal silica having a primary particle size of 5 nm or more and 100 nm or less and an average degree of association of 1.2 or more and 4.0 or less; and
   oxidizing the thiol group of the silane coupling agent coupled to the colloidal silica.

2. The method according to claim 1, wherein the primary particle size of the colloidal silica is calculated based on a specific surface area of the colloidal silica measured by a BET method.

3. The method according to claim 1, wherein said adjusting the pH of the polishing composition includes adjusting the pH to 4 or less.

4. The method according to claim 1, wherein the polishing composition is to be used to polish an object-to-be-polished that includes a material having a positive zeta-potential under a pH of 6 or less.

5. The method according to claim 4, wherein the material having a positive zeta-potential under a pH of 6 or less is silicon nitride.

6. The method according to claim 5, wherein the object-to-be-polished further includes polycrystalline silicon.

7. The method according to claim 6, wherein the polishing composition has a ratio of the rate of polishing silicon nitride to the rate of polishing polycrystalline silicon of 2 or more.

8. The method according to claim 1, wherein the colloidal silica has a non-spherical shape.

9. The method according to claim 1, wherein said adjusting the pH of the polishing composition includes using a dicarboxylic acid or a tricarboxylic acid as a pH adjuster.

* * * * *